(12) United States Patent
Nakazawa

(10) Patent No.: US 11,289,135 B1
(45) Date of Patent: Mar. 29, 2022

(54) PRECHARGE TIMING CONTROL

(71) Applicant: Micron Technology, Inc., Boise, ID (US)

(72) Inventor: Shigeyuki Nakazawa, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/115,327

(22) Filed: Dec. 8, 2020

(51) Int. Cl.
- *G11C 7/00* (2006.01)
- *G11C 7/10* (2006.01)
- *G11C 11/4074* (2006.01)
- *G11C 7/20* (2006.01)
- *G11C 7/22* (2006.01)

(52) U.S. Cl.
CPC .......... *G11C 7/1048* (2013.01); *G11C 7/1012* (2013.01); *G11C 7/20* (2013.01); *G11C 7/222* (2013.01); *G11C 11/4074* (2013.01)

(58) Field of Classification Search
CPC ....... G11C 7/1048; G11C 7/1012; G11C 7/20; G11C 7/222; G11C 11/4074
USPC .......................................................... 365/203
See application file for complete search history.

(56) References Cited

U.S. PATENT DOCUMENTS

| | | | | |
|---|---|---|---|---|
| 2008/0253210 | A1* | 10/2008 | Lee | G11C 7/18 365/203 |
| 2014/0297939 | A1* | 10/2014 | Perego | G11C 7/1072 711/105 |

\* cited by examiner

*Primary Examiner* — Huan Hoang
(74) *Attorney, Agent, or Firm* — Dorsey & Whitney LLP

(57) ABSTRACT

Apparatuses for controlling precharge timings in a semiconductor device are described. An example apparatus includes first and second memory and a precharge timing circuit. The first memory includes a first memory bank including a first data line and a second memory bank including a second data line. The second memory includes a third memory bank including a third data line and a fourth memory bank memory bank including a fourth data line. The precharge timing circuit provides first, second, third and fourth precharge activation signals. The first, second, third and fourth precharge activation signals activate precharge of the first, second, third and fourth data lines, respectively. The precharge timing circuit provides the first and second precharge activation signals at different times from each other. The precharge timing circuit provides the third and fourth precharge activation signals at different times from each other.

20 Claims, 5 Drawing Sheets

PRECHARGE TIMING CONTROL

BACKGROUND

High data reliability, high speed of memory access, reduced chip size and reduced power consumption are features that are demanded from semiconductor memory.

In memory, information may be written to or read from individual memory cells of the memory through data lines. For example, the memory may be volatile memory, such as dynamic random access memories (DRAMs), static RAMs (SRAMs), flash memories, or the like.

Data lines may transmit a high voltage or a low voltage to/from memory cells in order to read or write data. For example, the high voltage may correspond to "1" and the low voltage may correspond to "0" of digital data. To reduce the time to set data lines to either the high voltage or the low voltage for memory access operations, during which data is transmitted data to/from memory cells, data lines may be precharged upon powering up the memory. Precharge operations to data lines simultaneously during the initialization of the memory may cause an extreme amount of peak current within the memory. Such extreme amount of peak current may cause undesired effects on the memory or an external device coupled to the memory.

DETAILED DESCRIPTION OF PREFERRED EMBODIMENTS

Figure 1:
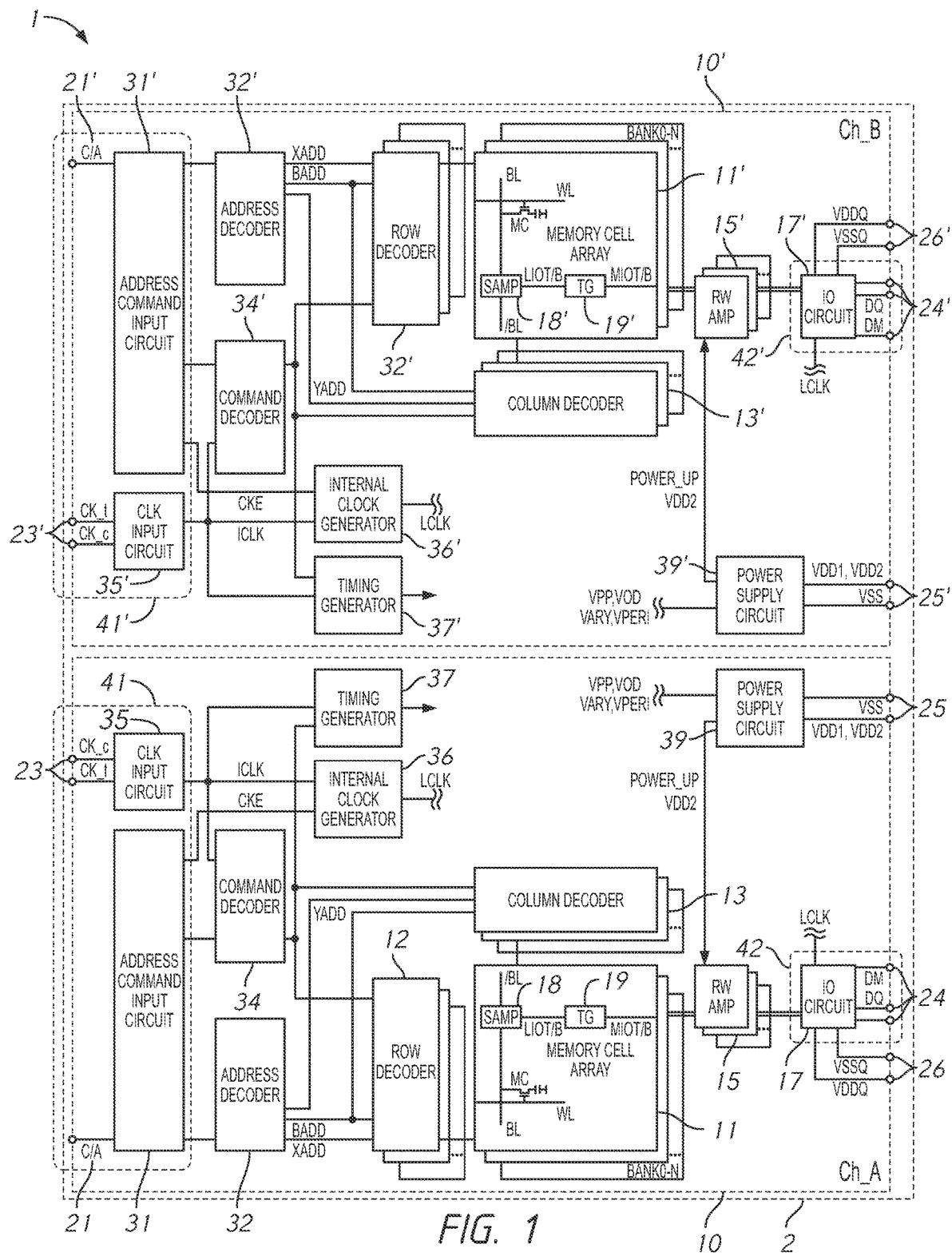
FIG. 1 is a block diagram of a semiconductor device in accordance with an embodiment of the present disclosure.

Various embodiments of the disclosure will be explained below in detail with reference to the accompanying drawings. The following detailed description refers to the accompanying drawings that show, by way of illustration, specific aspects and details in which embodiments of the disclosure may be practiced. The detailed description includes sufficient detail to enable those skilled in the art to practice embodiments of the disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Information may be stored on individual memory cells of the memory as a charge on a capacitive element. The magnitude of the charge (e.g., charge value) may be indicative of the information stored. In some embodiments, the magnitude of the charge, and thus the information on the memory cell, may be determined by measuring a voltage across the memory cell and/or detecting a current from the memory cell. A high voltage or current may be associated with a higher magnitude charge whereas a low voltage or current may be associated with a lower magnitude charge. High voltages (e.g., 3V, 5V) may be associated with high logic states and/or "1" whereas lower voltages (e.g., 0V) may be associated with low logic states and/or "0." To write a "1" to a memory cell, a memory line (e.g., data line) may be charged to a high voltage in order to charge the memory cell to the appropriate level. To write a "0" to the memory cell, the memory line may be charged to a lower voltage. Although the examples described herein associate low voltages with low logic states and "0" and high voltages with high logic states and "1," it is understood that these associations may be different without departing from the principles of the disclosure.

In some memory applications, it may be desirable to share one or more elements between memory arrays and/or portions of a memory array in a memory device. For example, it may be desirable to share an error correction circuit, bank logic, an amplifier, and/or an input/output line. Sharing one or more elements may reduce chip size and/or reduce the number of elements needed for the memory device. However, in some cases, sharing one or more elements may increase impedance experienced by the one or more shared elements. The increased impedance may increase rise times of one or more memory lines during some memory operations. That is, it may increase the time it takes for a line to be charged to a higher voltage (e.g., 3V, 5V) compared to a lower voltage (e.g., 0V). For example, during a write operation where a high charge value (e.g., to write a "1") is to be written to a memory cell, a memory line (e.g., data line) coupled to the memory cell must be charged to the higher voltage. When the memory line is long (e.g., shared between memory arrays or portions of a memory array), it may take longer to charge the memory line to the higher voltage. This may make writing information (e.g., data) that corresponds to high charge values (e.g., "1") take longer than writing information that corresponds to low charge values (e.g., "0").

To reduce the time difference in writing between the high charge values and low charge values, one or more precharge circuits which precharge memory lines to appropriate voltages prior to writing information may be included. The one or more precharge circuits may be activated at different timings to reduce a peak current.

FIG. 1 is a block diagram of a semiconductor device 1 in accordance with one embodiment of the present disclosure. The semiconductor device 1 may be DRAM integrated into a single semiconductor chip, for example. The semiconductor device 1 may be mounted on an external substrate 2, for example, a memory module substrate, a mother board or the like. As shown in FIG. 1, the semiconductor device 1 may include memory 10 and memory 10'. The memory 10 may be configured to be accessed through a memory channel (Ch_A) and the memory 10' may be configured to be accessed through a memory channel (Ch_B). The memory channel (Ch_A) and the memory channel (Ch_B) are independent from each other. The memory 10 and the memory 10' may include similar circuitry. Thus, some of detailed description of the memory 10' is omitted in the interest of brevity. In some embodiments, the semiconductor device 1 may be a chip including the memory 10 and the memory 10'.

The memory 10 includes a memory cell array 11. The memory cell array 11 includes a plurality of memory banks of the memory channel (Ch_A). The memory 10' includes a memory cell array 11'. The memory cell array 11' includes a plurality of memory banks of the memory channel (Ch_B). Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. In the embodiment of FIG. 1, the row decoder 12 includes a respective row decoder for each memory bank of the memory channel (Ch_A) and the column decoder 13 includes a respective column decoder for each memory bank. Sense amplifiers 18 are coupled to corresponding bit lines BL and connected to local I/O line pairs LIOT/B. Read data from the bit line BL is amplified by the sense amplifier 18, and provided to a sub-amplifier transfer gate 19 over complementary local data lines (LIOT/B) of the memory channel (Ch_A). The sub-amplifier transfer gate 19 may act as a switch to form a conductive path between the appropriate LIOT/B and appropriate shared complementary main data lines (MIOT/B) of the memory channel (Ch_A). Read data of the memory channel (Ch_A) may pass from the local data lines LIOT/B to the main data lines MIOT/B via a conductive path provided by the sub-amplifier transfer gate 19 to a read/write amplifier 15 of the memory channel (Ch_A), which provides the data to an input/output (IO) circuit 17 of the memory channel (Ch_A). Write data of the memory channel (Ch_A) received from the IO circuit 17 is provided to the read/write amplifier 15 and provided to the sense amplifier 18 over the main data lines MIOT/B, the sub-amp transfer gate 19, and the complementary local data lines LIOT/B, and written in the memory cell MC coupled to the bit line BL. The main data line pairs MIOT/B of the memory channel (Ch_A) may be precharged upon powering up the memory 10. Similarly, read data of the memory channel (Ch_B) may pass from the local data lines LIOT/B to the main data lines MIOT/B via a conductive path provided by the sub-amplifier transfer gate 19' to a read/write amplifier 15' of the memory channel (Ch_B), which provides the data to an input/output (IO) circuit 17' of the memory channel (Ch_B). Write data of the memory channel (Ch_B) received from the IO circuit 17' is provided to the read/write amplifier 15' and provided to the sense amplifier 18' over the main data lines MIOT/B, the sub-amp transfer gate 19', and the complementary local data lines LIOT/B, and written in the memory cell MC coupled to the bit line BL. The main data line pairs MIOT/B of the memory channel (Ch_B) may be precharged upon powering up the memory 10'.

Turning to the explanation of a plurality of external terminals included in the memory 10, the plurality of external terminals includes command/address terminals 21, clock terminals 23, data terminals 24, and power supply terminals 25 and 26. An input signal block 41 may include the command/address terminals 21. The command/address terminals 21 and signal lines coupled to the command/address terminal 21 may include a first set of terminals and signal lines that are configured to receive the command signals and a separate, second set of terminals and signal lines that configured to receive the address signals, in some examples. In other examples, the terminals 21 and signal lines associated with command/address terminals 21 the may include common terminals and signal lines that are configured to receive both command signal and address signals. The input signal block 41 may include the clock terminals 23 which include input buffers. A data interface block 42 includes the data terminals 24 that will be later described, according to one embodiment. The data terminals 24 may be coupled to output buffers for read operations of memories. Alternatively, the data terminals 24 may be coupled to input buffers for read/write access of the memories. FIG. 1 shows an example of dynamic random access memory (DRAM), however, any device having external terminals for signal input/output may be included as the external terminals of embodiments of the present disclosure.

The memory 10 accessed through the memory channel (Ch_A) includes a memory interface. For example, the memory interface may include an address/command input circuit 31. The memory 10' accessed through the memory channel (Ch_B) includes another memory interface independent from the memory interface of the memory channel (Ch_A). For example, the other memory interface may include an address/command input circuit 31'. The address/command input circuits 31 and 31' includes similar circuitry. Thus, detailed description of the address/command input circuit 31' is omitted in the interest of brevity. The address/command input circuit 31 may receive an address signal ADD and a bank address signal BADD from the command/address terminals 21, and transmit the address signal ADD and the bank address signal BADD to an address decoder 32. The address decoder 32 may decode the address signal ADD and provide a decoded row address signal XADD to the row decoder 12, and a decoded column address signal YADD to the column decoder 13. The address decoder 32 also may receive the bank address signal BADD and provide the bank address signal BADD to the row decoder 12 and the column decoder 13.

The address/command input circuit 31 may receive a command signal from outside, such as, for example, a memory controller, at the command/address terminals 21. The address/command input circuit 21 may provide the command signal to the command decoder 34. The command decoder 34 may decode the command signal and generate various internal command signals. The internal command signals may be used to control operation and timing of various circuits of the memory 10. For example, the internal command signals may include a row command signal, such as an active command, to select a word line and a column command signal, such as a read command or a write command, to select a bit line.

Accordingly, when an active command is issued with a row address and a column address is timely supplied with a read command, read data is read from a memory cell MC in the memory cell array 11 designated by these row address and column address. The read data DQ is output externally from the data terminals 24 via the read/write amplifier 15 and the IO circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK_t and CK_c, respectively. These external clock signals CK_t and CK_c are complementary to each other and are supplied to a clock input circuit 35. The clock input circuit 35 receives the external clock signals CK_t and CK_c and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD1, VDD2 and VSS. These power supply potentials VDD1, VDD2 and VSS are supplied to an internal power supply circuit 39. The internal power supply circuit 39 generates various internal potentials VPP, VOD, VARY, VPERI, and the like. The internal potential VPP is mainly used in the row decoder 12, the internal potentials VOD and VARY are mainly used in the sense amplifiers 18 included in the memory cell array 11, and the internal potential VPERI is used in many other circuit blocks. Upon detection of the power supply, the internal power supply circuit 39 may provide the power supply potential (e.g., VDD2) and a power up signal which triggers precharge operations of the main data line pairs MIOT/B. In some embodiments, the internal power supply circuit 39 may provide the power supply potential (e.g., VDD2) to the read/write amplifier 15.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD1 and VSS that are supplied to the power supply terminals 25, respectively. However, the power supply potentials VDDQ and VSSQ may be used for the input/output circuit 17 so that power supply noise generated by the input/output circuit 17 does not propagate to the other circuit blocks.

Figure 2:
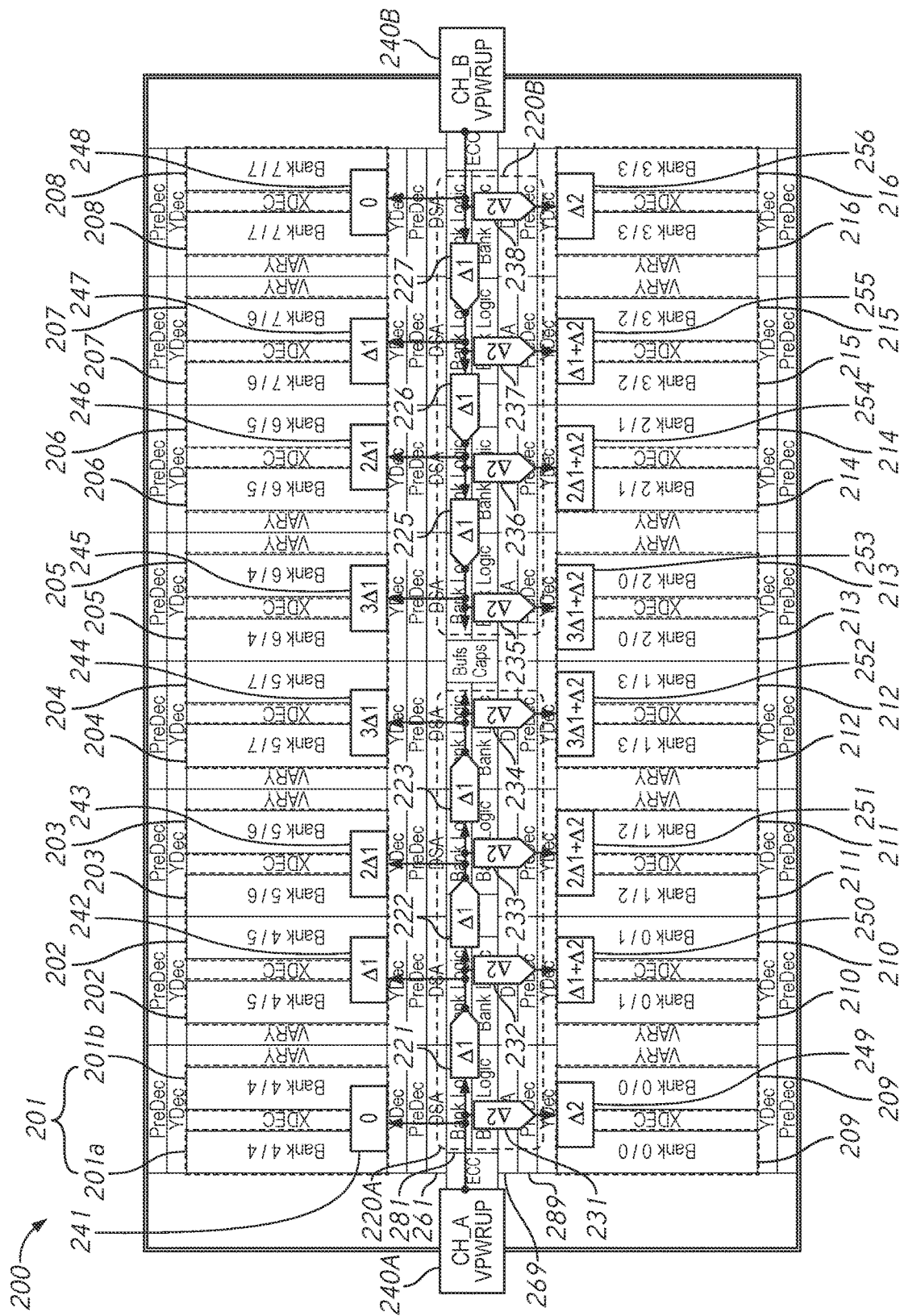
FIG. 2 is a layout diagram of a semiconductor device in accordance with an embodiment of the present disclosure.

FIG. 2 is a layout diagram of a portion of a semiconductor device 200 in accordance with an embodiment of the present disclosure. FIG. 2 may be a plan view of a layout of the semiconductor device 200, including circuits and array areas. The semiconductor device 200 may be the semiconductor device 1 of FIG. 1 in some embodiments of the disclosure. The semiconductor device 200 may be a memory die, such as a DRAM die in some embodiments of the disclosure.

The semiconductor device 200 may include multiple memory banks. In the example shown in FIG. 2, semiconductor device 200 includes sixteen memory banks 201-216. Each bank may be accessed by corresponding main data lines MIO. In some embodiments where the semiconductor device 200 may be the semiconductor device 1 of FIG. 1, the memory banks 201-204 and 209-212 are included in the memory cell array 11, and may be accessed by the main data line pairs MIOT/B of the memory channel (Ch_A) in the memory 10. The memory banks 205-208 and 213-216 are included in the memory cell array 11', and may be accessed by the main data line pairs MIOT/B of the memory channel (Ch_B) in the memory 10'. Each bank of the memory banks 201-216 may include one or more portions. In FIG. 2, for example, the memory bank 201 may include portions 201a and 201b. The one or more portions of each bank may share one or more circuits. For example, the one or more portions may share a main amplifier (DSA) and bank logic. In FIG. 2, for example, the portions 201a and 201b of the memory bank 201 may share a main amplifier (DSA) 261 and a bank logic 281. Furthermore, error correction circuitry (ECC) may be shared by multiple memory banks. For example, in the example shown in FIG. 2, one ECC may be shared by the memory banks 201-204 and 209-212. Another ECC may be shared by the memory banks 205-208 and 213-216. In some embodiments, each main amplifier DSA of each memory bank may be coupled to a corresponding main data line MIO. The main data line MIO of each memory bank may extend from each main amplifier DSA to a sub-amplifier transfer gate of each memory bank. In some embodiments, the sub-amplifier transfer gate may be the sub-amplifier transfer gate 19 or 19' of FIG. 1. In some embodiments, the main amplifier DSA may include read and/or write amplifiers for one or more sections of memory and/or portions of memory arrays. In some embodiments, the read and/or write amplifiers in the main amplifiers (DSA) may be included in the read and write amplifiers 15 in FIG. 1. In some embodiments, the read and/or write amplifiers in the main amplifiers DSA may be included in the read and write amplifiers 15' in FIG. 1. In the example shown in FIG. 2, the one or more portions of each bank of the memory banks 201-216 may share read and/or write amplifiers included in a corresponding shared main amplifier DSA.

In FIG. 2, portions of each of the memory banks 201-216 may share corresponding precharge circuits 241-256. For example, portions 201a and 201b of the memory bank 201 may share the precharge circuit 241. In some embodiments, the precharge circuits 241-244 and 249-252 for the corresponding memory banks 201-204 and 209-212 may be disposed in the memory 10. In some embodiments, the precharge circuits 241-244 and 249-252 may be disposed in the memory cell array 11. In some embodiments, the precharge circuits 241-244 and 249-252 within the memory 10 may be disposed outside the memory cell array 11. In some embodiments, the precharge circuits 245-248 and 253-256 for the corresponding memory banks 205-208 and 213-216 may be disposed in the memory 10'. In some embodiments, the precharge circuits 245-248 and 253-256 may be disposed in the memory cell array 11'. In some embodiments, the precharge circuits 245-248 and 253-256 within the memory 10' may be disposed outside the memory cell array 11'. The precharge circuits 241-256 may each be coupled to the data lines MIO of a corresponding memory bank 201-216, and precharge the respective data lines MIO to a precharge voltage when activated.

The semiconductor device 200 may further include precharge timing circuits 220A and 220B. In some embodiments, the precharge timing circuit 220A may be disposed between the power supply circuit 39 and the read and write amplifier 15 in FIG. 1. In some embodiments, the precharge timing circuit 220A may be included in the read and write amplifier 15 in FIG. 1. In some embodiments, the precharge timing circuit 220A may be disposed between the read and write amplifier 15 and the memory cell array 11 in FIG. 1. In some embodiments, the portions of the precharge timing circuit 220A may be included in the main amplifiers DSA of the memory bank 201-204 and 209-212. In some embodiments, the precharge timing circuit 220A may be disposed between the bank logics of the memory bank 201-204 and 209-212.

The precharge timing circuit 220A may provide precharge activation signals to the precharge circuits 241-244 and 249-252 for corresponding memory banks 201-204 and 209-212. In some embodiments, the precharge activation signals may be power-up signals with different respective delays. The precharge activation signals may be used to perform precharge operations with different timings to the main data lines MIO of the memory banks 201-204 and 209-212. In some embodiments, a voltage power-up circuit 240A may be included in the power supply circuit 39. In some embodiments, the precharge circuits 241-244 and 249-252 may receive power supply potential (e.g., VDD2) from a power supply circuit, for example, the power supply circuit 39 or 39' shown in FIG. 1. The voltage power-up circuit 240A may detect whether the power supply circuit 39 starts receiving the power supply potentials (e.g., VDD1 and VDD2). Responsive to the detection, the voltage power-up circuit 240A may provide a power-up signal in an active state (e.g., the power-up signal is being activated). For example, the power-up signal in an active state may be at a logic-high level. In some embodiments, the precharge timing circuit 220A may receive the power-up signal for the memory banks 201-204 and 209-212 accessed by the memory channel (Ch_A) from the voltage power-up circuit 240A.

The precharge timing circuit 220A may include delay circuits 221-223 coupled in series. In some embodiments, each of the delay circuits 221-223 may have a delay $\Delta 1$. The precharge timing circuit 220A may also include delay circuits 231-234. The delay circuits 231-233 may be coupled to input nodes of the delay circuits 221-223 respectively. The delay circuit 234 may be coupled to an output node of the delay circuit 223. In some embodiments, each of the delay circuits 231-234 may have a delay $\Delta 2$. The delay $\Delta 1$ may be longer than the delay $\Delta 2$.

In the example of FIG. 2, the precharge timing circuit 220A may provide the power-up signal received from the voltage power-up circuit 240A as a precharge activation signal to the precharge circuit 241. The precharge circuit 241 may start a precharge operation to a main data line MIO of the memory bank 201 responsive to the precharge activation signal. The precharge timing circuit 220A may also provide the power-up signal received from the voltage power-up circuit 240A to the delay circuits 221 and 231. The delay circuit 231 may provide the power-up signal delayed by the delay $\Delta 2$ as another precharge activation signal to the precharge circuit 249. The precharge circuit 249 may start a precharge operation to a main data line MIO of the memory bank 209 responsive to the precharge activation signal that is the power-up signal delayed by the delay $\Delta 2$. Thus, the precharge operation to the main data line MIO of the memory bank 209 may occur after the precharge operation to the main data line MIO of the memory bank 201 occurs.

The delay circuit 221 may provide the power-up signal delayed by the delay $\Delta 1$ as another precharge activation signal to the precharge circuit 242. The precharge circuit 242 may start a precharge operation to a main data line MIO of the memory bank 202 responsive to the power-up signal delayed by the delay $\Delta 1$. Because the delay $\Delta 1$ is longer than the delay $\Delta 2$, the precharge operation to the main data line MIO of the memory bank 202 may occur after the precharge operation to the main data line MIO of the memory bank 209 occurs. The delay circuit 232 may provide the power-up signal having the delay $\Delta 1$ further delayed by the delay $\Delta 2$ to the precharge circuit 250. The precharge circuit 250 may start a precharge operation to a main data line MIO of the memory bank 210 responsive to the power-up signal delayed by the delay $\Delta 1+\Delta 2$. Thus, the precharge operation to the main data line MIO of the memory bank 210 may occur after the precharge operation to the main data line MIO of the memory bank 202 occurs.

The delay circuit 222 may provide the delayed power-up signal from the delay circuit 222 that is further delayed by the delay $\Delta 1$ to the precharge circuit 243, and the delay circuits 223 and 233. The precharge circuit 243, and the delay circuits 223 and 233 may receive the power-up signal delayed by delay $2\times\Delta 1$ ($\Delta 1$ multiplied by 2) from the delay circuit 222. The precharge circuit 243 may start a precharge operation to a main data line MIO of the memory bank 203 responsive to the power-up signal delayed by the delay $2\times\Delta 1$. Because the delay $2\times\Delta 1$ is longer than the delay $\Delta 1+\Delta 2$, the precharge operation to the main data line MIO of the memory bank 203 may occur after the precharge operation to the main data line MIO of the memory bank 210 occurs. The delay circuit 233 may provide the power-up signal having the delay $2\times\Delta 1$ further delayed by the delay $\Delta 2$ to the precharge circuit 251. The precharge circuit 251 may start a precharge operation to a main data line MIO of the memory bank 211 responsive to the power-up signal delayed by the delay $(2\times\Delta 1)+\Delta 2$. Thus, the precharge operation to the main data line MIO of the memory bank 211 may occur after the precharge operation to the main data line MIO of the memory bank 203 occurs.

The delay circuit 223 may provide the delayed power-up signal from the delay circuit 222 that is further delayed by the delay $\Delta 1$ to the precharge circuit 244 and the delay circuit 234. The precharge circuit 244 and the delay circuit 234 may receive the power-up signal delayed by delay $3\times\Delta 1$ ($\Delta 1$ multiplied by 3) from the delay circuit 223. The precharge circuit 244 may start a precharge operation to a main data line MIO of the memory bank 204 responsive to the power-up signal delayed by the delay $3\times\Delta 1$. Because the delay $3\times\Delta 1$ is longer than the delay $(2\times\Delta 1)+\Delta 2$, the precharge operation to the main data line MIO of the memory bank 204 may occur after the precharge operation to the main data line MIO of the memory bank 211 occurs. The delay circuit 234 may provide the power-up signal having the delay $3\times\Delta 1$ further delayed by the delay $\Delta 2$ to the precharge circuit 252. The precharge circuit 252 may start a precharge operation to a main data line MIO of the memory bank 212 responsive to the power-up signal delayed by the delay $(3\times\Delta 1)+\Delta 2$. Thus, the precharge operation to the main data line MIO of the memory bank 212 may occur after the precharge operation to the main data line MIO of the memory bank 204 occurs. Since the precharge timing circuit 220A may provide the power-up signals delayed by different delays (e.g., the power-up signals are activated at different timings) to the precharge circuits 241-244 and 249-252, precharge operations to the main data lines MIO of the memory banks 201-204 and 209-212 may be performed at different timings by the precharge circuits 241-244 and 249-252.

In some embodiments, the precharge timing circuit 220B may be disposed between the power supply circuit 39' and the read and write amplifier 15' in FIG. 1. In some embodiments, the precharge timing circuit 220B may be included at the read and write amplifier 15' in FIG. 1. In some embodiments, the precharge timing circuit 220B may be disposed between the read and write amplifier 15' and the memory cell array 11' in FIG. 1. In some embodiments, the portions of the precharge timing circuit 220B may be included in the main amplifiers DSA of the memory bank 205-208 and 213-216. In some embodiments, the precharge timing circuit 220B may be disposed between the bank logics of the memory bank 205-208 and 213-216.

The precharge timing circuit 220B may activate provide precharge activation signals to the precharge circuits 245-248 and 253-256 for corresponding banks 205-208 and 213-216. In some embodiments, the precharge activation signals may be power-up signals with different respective delays. The precharge activation signals may be used to perform precharge operations with different timings to the main data lines MIO coupled the memory banks 205-208 and 213-216. A voltage power-up circuit 240B may be included in the power supply circuit 39'. In some embodiments, the precharge circuits 245-248 and 253-256 may receive power supply potential (e.g., VDD2) from a power supply circuit, for example, the power supply circuit 39 or 39' shown in FIG. 1. The voltage power-up circuit 240B may detect whether the power supply circuit 39' starts receiving the power supply potentials (e.g., VDD1 and VDD2). Responsive to the detection, the voltage power-up circuit 240B may provide a power-up signal in an active state. In some embodiments, the precharge timing circuit 220B may receive the power up signal for the memory banks 205-208 and 213-216 accessed by the memory channel (Ch_B) from the voltage power-up circuit 240B.

The precharge timing circuits 220A and 220B includes similar circuitry. Thus, detailed description of the precharge timing circuit 220B is omitted in the interest of brevity. The precharge timing circuits may provide the power up signal as a precharge timing to a precharge circuit 248. The precharge timing circuit 220B may provide the power-up signals with delays $\Delta 1$, $2 \times \Delta 1$, $3 \times \Delta 1$ as precharge activation signals to the precharge circuits 247, 246 and 245, respectively. The precharge timing circuit 220B may provide the power-up signals with delays $\Delta 2$, $\Delta 1+\Delta 2$, $(2 \times \Delta 1)+\Delta 2$, $(3 \times \Delta 1)+\Delta 2$ as precharge activation signals to the precharge circuits 256, 255, 254 and 253, respectively. Since the precharge timing circuit 220B may provide the power-up signals received delayed by different delays (e.g., the power-up signals are activated at different timings) to the precharge circuits 245-248 and 253-256, precharge operations to main data lines MIO of the memory banks 205-208 and 213-216 may be performed at different timings by the precharge circuits 245-248 and 253-256. In some embodiments, the power supply circuits 39 and 39' in FIG. 1 may start receiving the power supply potentials (e.g., VDD1 and VDD2) simultaneously. One of the precharge circuits 241-244 and 249-252 and one of the precharge circuits 245-248 and 253-256 may perform precharge operations simultaneously.

Figure 3:
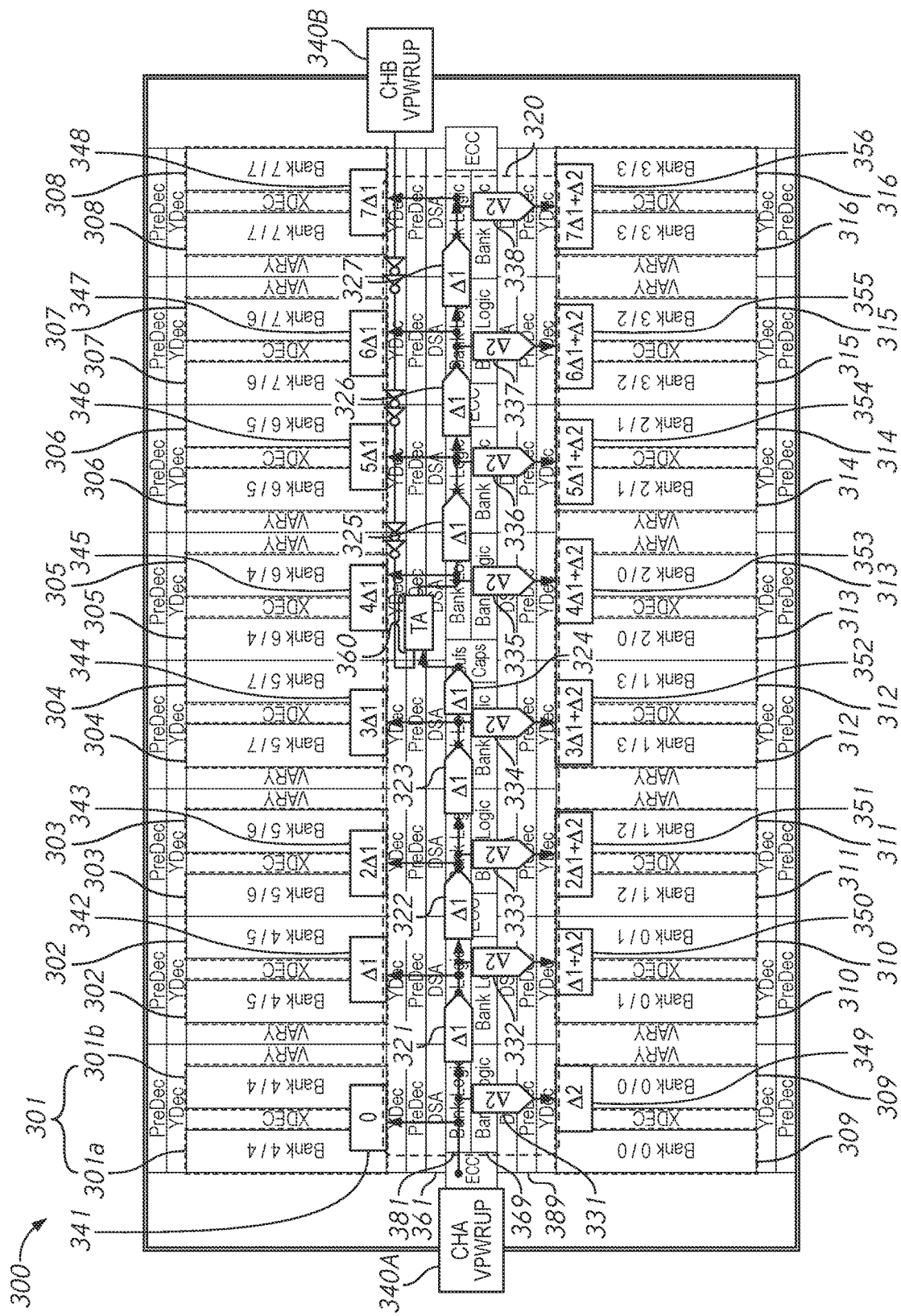
FIG. 3 is a layout diagram of a semiconductor device in accordance with an embodiment of the present disclosure.

FIG. 3 is a layout diagram of a portion of a semiconductor device 300 in accordance with an embodiment of the present disclosure. FIG. 3 may be a plan view of a layout of the semiconductor device 300, including circuits and array areas. The semiconductor device 300 may be the semiconductor device 1 of FIG. 1 in some embodiments of the disclosure. The semiconductor device 300 may be a memory die, such as a DRAM die.

The semiconductor device 300 may include multiple memory banks. In the example shown in FIG. 3, semiconductor device 300 includes sixteen memory banks 301-316. Each bank may be accessed by corresponding main data line MIO. In some embodiments, the memory banks 301-304 and 309-312 included in the memory cell array 11 may be accessed by the main data line pairs MIOT/B of the memory channel (Ch_A) in the memory 10 of the semiconductor device 1 in FIG. 1. The memory banks 305-308 and 213-216 in the memory cell array 11' may be accessed by the main data line pairs MIOT/B of the memory channel (Ch_B) in the memory 10'. Each bank of the memory banks 201-216 may include one or more portions. In FIG. 3, for example, the memory bank 301 may include portions 301a and 301b. The one or more portions of each bank may share one or more memory elements. For example, the one or more portions may share a main amplifier (DSA) and bank logic. In FIG. 3, for example, the portions 301a and 301b of the memory bank 301 may share a main amplifier (DSA) 361 and a bank logic 381. Furthermore, error correction circuitry (ECC) may be shared by multiple memory banks. For example, in the example shown in FIG. 3, one ECC may be shared by the memory banks 301-304 and 309-312. Another ECC may be shared by the memory banks 305-308 and 313-316. In some embodiments, each main amplifier DSA of each memory bank may be coupled to the corresponding main data line MIO. The main data line MIO of each memory bank may extend from each main amplifier DSA to a sub-amplifier transfer gate of each memory bank. In some embodiments, the sub-amplifier transfer gate may be the sub-amplifier transfer gate 19 or 19' of FIG. 1. In some embodiments, the main amplifier DSA may include read and/or write amplifiers for one or more sections of memory and/or portions of memory arrays. In some embodiments, the read and/or write amplifiers in the main amplifiers DSA may be included in the read and write amplifiers 15 in FIG. 1. In some embodiments, the read and/or write amplifiers in the main amplifiers DSA may be included in the read and write amplifiers 15' in FIG. 1. In the example shown in FIG. 3, the one or more portions of each bank of the memory banks 301-316 may share read and/or write amplifiers included in a corresponding shared main amplifier DSA.

In FIG. 3, the one or more portions of each of the memory banks 301-316 may share corresponding precharge circuits 341-356. For example, the one or more portions 301a and 301b of the memory bank 301 may share the precharge circuit 241. In some embodiments, the precharge circuits 341-344 and 349-352 for the corresponding memory banks 301-304 and 309-312 may be disposed in the memory 10. In some embodiments, the precharge circuits 341-344 and 349-352 may be disposed in the memory cell array 11. In some embodiments, the precharge circuits 341-344 and 349-352 within the memory 10 may be disposed outside the memory cell array 11. In some embodiments, the precharge circuits 345-348 and 353-356 for the corresponding memory banks 305-308 and 313-316 may be disposed in the memory 10'. In some embodiments, the precharge circuits 345-348 and 353-356 may be disposed in the memory cell array 11'. In some embodiments, the precharge circuits 345-348 and 353-356 within the memory 10' may be disposed outside the memory cell array 11'. The precharge circuits 341-356 may each be coupled to the data lines MIO of a corresponding memory bank 301-316, and precharge the respective data lines MIO to a precharge voltage when activated.

The semiconductor device 300 may further include a precharge timing circuit 320. In some embodiments, the precharge timing circuit 320 may be disposed in areas in proximity to the power supply circuits 39 and 39' of FIG. 1. For example, the areas may include an area between the power supply circuit 39 and the read and write amplifier 15 and an area between the power supply circuit 39' and the read and write amplifier 15' in FIG. 1. In some embodiments, the precharge timing circuit 320 may be included in the read and write amplifiers 15 and 15' in FIG. 1. In some embodiments, the precharge timing circuit 320 may be disposed in areas in proximity to the memory cell arrays 11 and 11' of FIG. 1. The areas may include an area between the read and write amplifier 15 and the memory cell array 11 and an area between the read and write amplifier 15' and the memory cell array 11' in FIG. 1. In some embodiments, the portions of the precharge timing circuit 320 may be included in the main amplifiers DSA for the memory bank 301-316. In some embodiments, the precharge timing circuit 320 may be disposed between the bank logics of the memory bank 301-316.

The precharge timing circuit 320 may provide precharge activation signals to the precharge circuits 341-356 for corresponding memory banks 301-316. In some embodiments, the precharge activation signals may be power-up signals with different respective delays. The precharge activation signals may be used to perform precharge operations with different timings to the main data lines MIO of the memory banks 301-316. In some embodiments, a voltage power-up circuit 340A for a memory channel (Ch_A) may be included in the power supply circuit 39. The voltage power-up circuit 340A may detect whether the power supply circuit 39 starts receiving the power supply potentials (e.g., VDD1 and VDD2). Responsive to the detection, the voltage power-up circuit 340A may provide a power-up signal in an active state. In some embodiments, the precharge timing circuit 320 may receive the power-up signal for the memory banks 301-304 and 309-312 accessed by the memory channel (Ch_A) from the voltage power-up circuit 340A. The precharge timing circuit 320 may include delay circuits 321-324 coupled in series. In some embodiments, each of the delay circuits 321-324 may have a delay $\Delta 1$. The precharge timing circuit 320 may include delay circuits 331-334. The delay circuits 331-334 are coupled to input nodes of the delay circuits 321-324 respectively. In some embodiments, each of the delay circuits 331-334 may have a delay $\Delta 2$. The delay $\Delta 1$ may be longer than the delay $\Delta 2$. In the example of FIG. 3, the precharge timing circuit 320 may provide the power-up signal from the voltage power-up circuit 340A as a precharge activation signal to the precharge circuit 341. The precharge timing circuit 320 may provide the power-up signals with delays $\Delta 1$, $2\times\Delta 1$, $3\times\Delta 1$ as precharge activation signals to the precharge circuits 342, 343 and 344 from the delay circuits 321-323 respectively. The precharge timing circuit 320 may provide the power-up signals with delays $\Delta 2$, $\Delta 1+\Delta 2$, $(2\times\Delta 1)+\Delta 2$, $(3\times\Delta 1)+\Delta 2$ as precharge activation signals to the precharge circuits 349, 350, 351 and 352, respectively.

In some embodiments, a voltage power-up circuit 340B for a memory channel (Ch_B) may be included in the power supply circuit 39'. The voltage power-up circuit 340B may detect whether the power supply circuit 39' starts receiving the power supply potentials (e.g., VDD1 and VDD2). Responsive to the detection, the voltage power-up circuit 340B may provide a power-up signal in an active state. In some embodiments, the precharge timing circuit 320 may receive the power-up signal for the memory banks 305-308 and 313-316 accessed by the memory channel (Ch_B) from the voltage power-up circuit 340B. The precharge timing circuit 320 may include a time adjustment circuit 360. The time adjustment circuit 360 controls the timing of activating the precharge circuits 345-348 and 353-356 for the memory banks 305-308 and 313-316 accessed by the memory channel (Ch_B) to begin after the activation of most, if not all of the precharge circuits 341-344 and 349-352 for the memory banks 301-304 and 309-312 accessed by the memory channel (Ch_A). As a result, precharge operations to the main data lines MIO of the memory banks 305-308 and 313-316 accessed by the memory channel (Ch_B) may be performed following most of the precharge operations to the main data lines MIO of the memory banks 301-304 and 309-312 accessed by the memory channel (Ch_A).

The time adjustment circuit 360 may receive the power-up signal from the voltage power-up circuit 340B with some delay (e.g., a delay due to buffers preventing signal attenuation, etc.). The time adjustment circuit 360 may also receive the power-up signal from the voltage power-up circuit 340A with a delay from the delay circuit 324. In some embodiments, the delay may be a sum of delays of the delay circuits 321-324 coupled in series. The time adjustment circuit 360 may provide the power up signal from the voltage power-up circuit 340B in an active state responsive to the power up signal from the voltage power-up circuit 340A in an active state as a precharge activation signal. In some embodiments, the power supply circuits 39 and 39' in FIG. 1 may start receiving the power supply potentials (e.g., VDD1 and VDD2) simultaneously. In such embodiments, the precharge activation signal may be the power up signal from the voltage power-up circuit 340A with a delay $4\times\Delta 1$. In some embodiments, the time adjustment circuit 360 may include an inverted AND gate (NAND) logic circuit which receives the power up signal from the voltage power-up circuit 340A with the delay $4\times\Delta 1$ and the power up signal from the voltage power-up circuit 340B with some delay. The time adjustment circuit 360 may also include an inverter which provides an inverted output signal of the NAND logic circuit as the precharge activation signal. The circuitry of the time adjustment circuit 360 may not be limited to this combination of logic circuits. Any variations of circuitry that may function as the time adjustment circuit 360 may be included in the precharge timing circuit 320.

The precharge timing circuit 320 may include delay circuits 325-327 coupled in series. In some embodiments, each of the delay circuits 325-327 may have a delay $\Delta 1$. The precharge timing circuit 320 may also include delay circuits 335-338. The delay circuits 335-337 may be coupled to input nodes of the delay circuits 325-327 respectively. The delay circuit 338 may be coupled to an output node of the delay circuit 327. In some embodiments, each of the delay circuits 335-338 may have a delay $\Delta 2$. In the example of FIG. 3, the precharge circuit 345 may receive the precharge activation signal from the time adjustment circuit 360. The precharge circuit 345 may start a precharge operation to a main data line MIO of the memory bank 305 responsive to the precharge activation signal (e.g., the power up signal from the voltage power-up circuit 340A with the delay $4\times\Delta 1$). The time adjustment circuit 360 may also provide the precharge activation signal to the delay circuits 325 and 335. The delay circuit 335 may provide the precharge activation signal delayed by the delay $\Delta 2$ to the precharge circuit 353. The precharge circuit 353 may start a precharge operation to a main data line MIO of the memory bank 313 responsive to the precharge activation signal delayed by the delay $\Delta 2$ (e.g., the power up signal from the voltage power-up circuit 340A with the delay $(4\times\Delta 1)+\Delta 2$). Thus, the precharge operation to the main data line MIO of the memory bank 313 may occur after the precharge operation to the main data line MIO of the memory bank 305 occurs. The delay circuit 325 may provide the precharge activation signal delayed by the delay $\Delta 1$ to the precharge circuit 346. The precharge circuit 346 may start a precharge operation to a main data line MIO of the memory bank 306 responsive to the precharge activation signal delayed by the delay $\Delta 1$ (e.g., the power up signal from the voltage power-up circuit 340A with the delay $5\times\Delta 1$). Because the delay $\Delta 1$ is longer than the delay $\Delta 2$, the precharge operation to the main data line MIO of the memory bank 306 may occur after the precharge operation to the main data line MIO of the memory bank 313 occurs. The delay circuit 336 may receive the precharge activation signal delayed by the delay $\Delta 1$ from the delay circuit 325. The delay circuit 336 may provide the precharge activation signal delayed by a delay $\Delta 1+\Delta 2$ to the precharge circuit 354. The precharge circuit 354 may start a precharge operation to a main data line MIO of the memory bank 314 responsive to the precharge activation signal delayed by the delay $\Delta 1+\Delta 2$ (e.g., the power up signal from the voltage power-up circuit 340A with the delay $(5\times\Delta 1)+\Delta 2$). Thus, the precharge operation to the main data line MIO of the memory bank 314 may occur after the precharge operation to the main data line MIO of the memory bank 306 occurs. The delay circuit 326 may provide the precharge activation signal delayed by the delay 2×Δ1 to the precharge circuit 347. The precharge circuit 347 may start a precharge operation to a main data line MIO of the memory bank 307 responsive to the precharge activation signal delayed by the delay 2×Δ1 (e.g., the power up signal from the voltage power-up circuit 340A with the delay 6×Δ1). Because the delay Δ1 is longer than the delay Δ2, the precharge operation to the main data line MIO of the memory bank 307 may occur after the precharge operation to the main data line MIO of the memory bank 314 occurs. The delay circuit 337 may receive the precharge activation signal delayed by the delay 2×Δ1 from the delay circuit 326. The delay circuit 337 may provide the precharge activation signal delayed by a delay (2×Δ1)+Δ2 to the precharge circuit 355. The precharge circuit 355 may start a precharge operation to a main data line MIO of the memory bank 315 responsive to the precharge activation signal delayed by the delay (2×Δ1)+Δ2 (e.g., the power up signal from the voltage power-up circuit 340A with the delay (6×Δ1)+Δ2). Thus, the precharge operation to the main data line MIO of the memory bank 315 may occur after the precharge operation to the main data line MIO of the memory bank 307 occurs. The delay circuit 327 may provide the precharge activation signal delayed by the delay 3×Δ1 to the precharge circuit 348. The precharge circuit 348 may start a precharge operation to a main data line MIO of the memory bank 308 responsive to the precharge activation signal delayed by the delay 3×Δ1 (e.g., the power up signal from the voltage power-up circuit 340A with the delay 7×Δ1). Because the delay Δ1 is longer than the delay Δ2, the precharge operation to the main data line MIO of the memory bank 308 may occur after the precharge operation to the main data line MIO of the memory bank 315 occurs. The delay circuit 338 may receive the precharge activation signal delayed by the delay 3×Δ1 from the delay circuit 327. The delay circuit 338 may provide the precharge activation signal delayed by a delay (3×Δ1)+Δ2 to the precharge circuit 356. The precharge circuit 356 may start a precharge operation to a main data line MIO of the memory bank 316 responsive to the precharge activation signal delayed by the delay (3×Δ1)+Δ2 (e.g., the power up signal from the voltage power-up circuit 340A with the delay (7×Δ1)+Δ2). Thus, the precharge operation to the main data line MIO of the memory bank 316 may occur after the precharge operation to the main data line MIO of the memory bank 308 occurs.

Because the time adjustment circuit 360 may provide the power up signal from the voltage power-up circuit 340B in the active state when the power up signal from the voltage power-up circuit 340A is the active state, the precharge timing circuit 320 may provide the power-up signals delayed by different delays to the precharge circuits 341-356, including the power-up signals delayed by longer delays to the precharge circuits 345-348 and 353-356. Thus, precharge operations to the main data line MIO of the memory banks 301-316 may be performed at different timings by the precharge circuits 341-356. Thus, peak current within the semiconductor device 300 may be reduced by performing the precharge operations to main data lines MIO of multiple memory banks at different timings.

Figure 4:
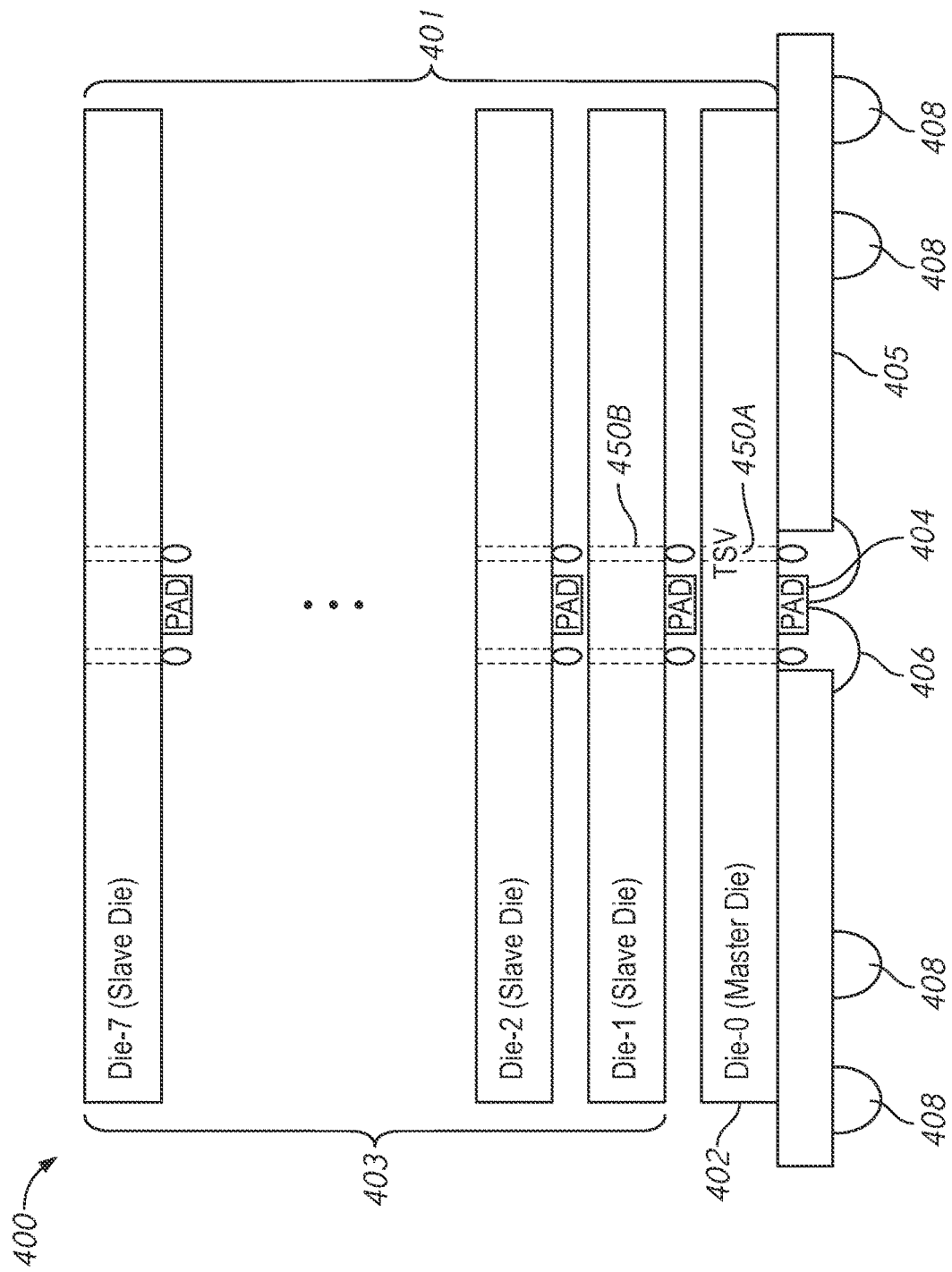
FIG. 4 is a schematic diagram of a semiconductor device including a plurality of dies in accordance with an embodiment of the present disclosure.

FIG. 4 is a schematic diagram of a memory device 400 including a plurality of dies 401 in accordance with an embodiment of the present disclosure. In some embodiments of the disclosure, one or more of the dies 401 may include the memory 10 of FIG. 1, the semiconductor device 200 of FIG. 2, the semiconductor device 300 of FIG. 3, or combinations thereof. In the embodiment of FIG. 4, the number of the plurality of dies 401 is eight. Modifications including changing to a different number of dies in place of the plurality of dies 401 are within the scope of disclosure. In some embodiments, the plurality of dies 401 may be identical with each other with respect to circuit configurations and operations. For example, the plurality of dies 401 may be stacked dies including a master die (Die-0) 402 and a plurality of slave dies (Die-1 to Die-7) 403. In some embodiments, the plurality of dies 401 may all have the same design (e.g., include the same circuits). The dies 401 may be configured during post-manufacturing to perform as either a master die or a slave die. For example, the plurality of dies 401 may be configured in a manner that one die may perform as the master die 402 and the other dies may perform as the slave dies 403 respectively. Alternatively, in some embodiments, the master die 402 and the slave dies 403 may be designed and manufactured as a native master die and native slave dies.

The master die 402 may serve as a includes one or more pads PAD 404 that are coupled to a package substrate 405 via one or more bonding wires 406. The one or more bonding wires 16 may be coupled to lands (not shown) of the package substrate 405. Bonding Pads (PAD) of each of the plurality of slave dies 403 may be in a floating state, decoupled from the package substrate 405. The master die 401 may communicate with each of the slave dies 403 by way of vias TSV (e.g., through-substrate or through-silicon vias) between adjacent dies of the plurality of dies 401, including vias 450A and 450B. Bump electrodes 408 may be disposed on an outer surface of the package substrate 408. The bump electrodes 408 may be coupled to power lines or signal channels.

Figure 5:
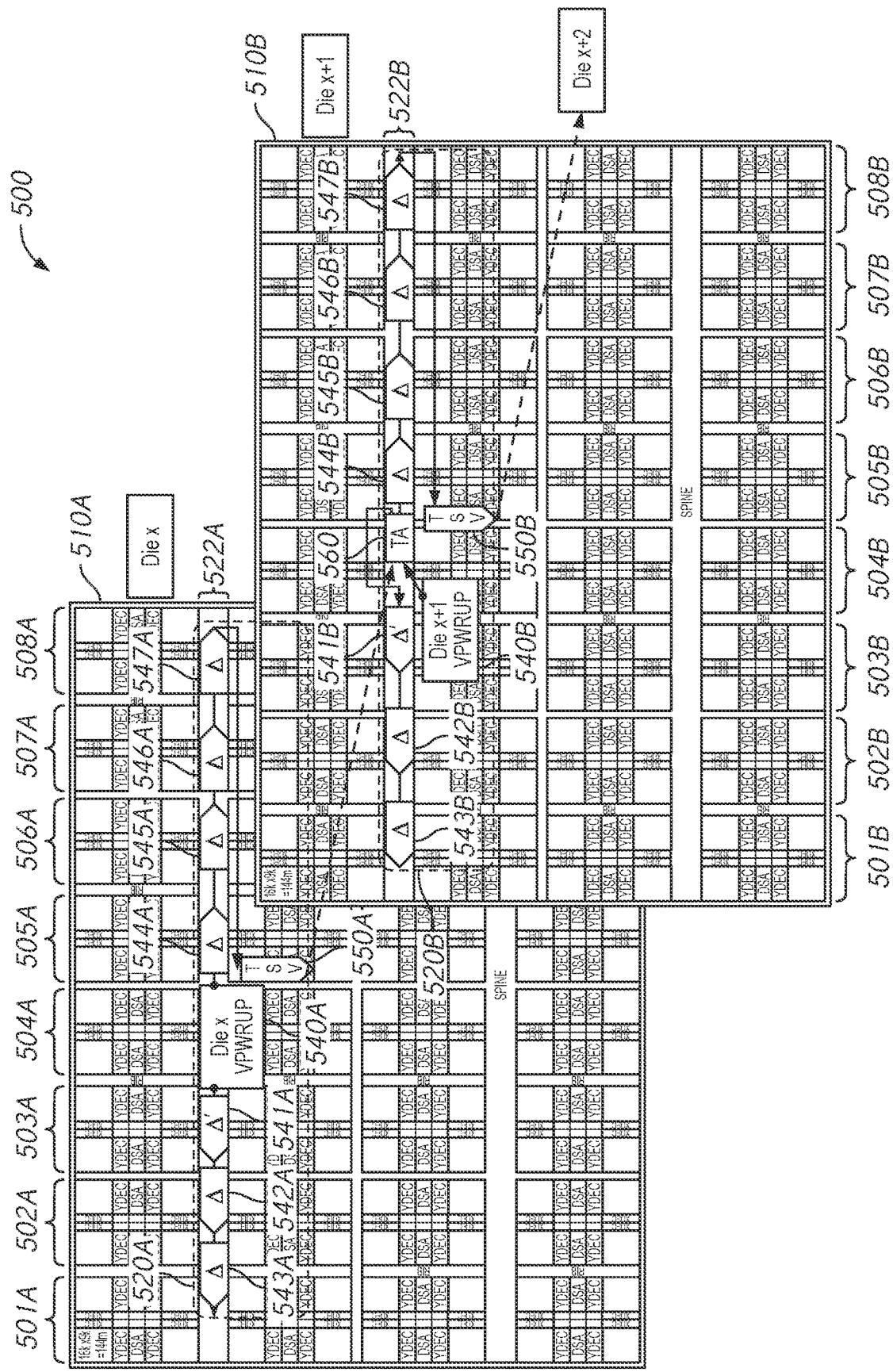
FIG. 5 is a layout diagram of a semiconductor device including a plurality of dies in accordance with an embodiment of the present disclosure.

FIG. 5 is a layout diagram of a semiconductor device 500 including a plurality of dies in accordance with an embodiment of the present disclosure. In FIG. 5, the plurality of dies includes a die (Die x) 510A and a die (Die x+1) 510B. In some embodiments, the dies 510A and 510B may be included in the plurality of dies 401. Each die may include a plurality of bank groups. In the example shown in FIG. 5, the die 510A may include bank groups 501A-508A and the die 510B may include bank groups 501B-508B. Each bank group may include a plurality of banks. In some embodiments, the bank groups may include the plurality of memory banks of the memory cell arrays 11 and 11'. Each bank group of the plurality of bank groups 501A-508A may be divided into two regions. The die 510A may also include a region 522A disposed across the plurality of bank groups 501A-508A, between the divided two regions of each bank group. In some embodiments, the region 522A may include main amplifiers DSA and bank logic for bank groups 501A-508A. Similarly, each bank group of the plurality of bank groups 501B-508B may be divided into two regions. The die 510B may also include a region 522B disposed across the plurality of bank groups 501B-508B, between the divided two regions of each bank group. In some embodiments, the region 522B may include main amplifiers DSA and bank logic for bank groups 501B-508B.

The semiconductor device 500 may further include a precharge timing circuit 520 including circuits 520A and 520B. In some embodiments, the circuits 520A and 520B may be disposed in the regions 522A and 522B respectively. The circuit 520A may provide precharge activation signals to precharge circuits (not shown) for corresponding bank groups 501A-508A. In some embodiments, the precharge activation signals may be power-up signals with different respective delays. The precharge activation signals may be used to perform precharge operations with different timings to main data lines MIO of the bank groups 501A-508A. In some embodiments, the die 510A may include a voltage power-up circuit 540A for the die 510A. The voltage power-up circuit 540A may detect whether a power supply circuit for the die 510A (not shown) starts receiving the power supply potentials (e.g., VDD1 and VDD2). Responsive to the detection, the voltage power-up circuit 540A may provide a power-up signal in an active state. In some embodiments, the circuit 520A may receive the power-up signal for the bank groups 501A-508A from the voltage power-up circuit 540A. The circuit 520A may include delay circuits 541A-543A coupled in series. The circuit 520A may also include delay circuits 544A-547A coupled in series. In some embodiments, each of the delay circuit 542A-547A may have a delay $\Delta$ and the delay circuit 541A may have a delay $\Delta'$. The circuit 520A may provide the power-up signals with delays $\Delta'$, $\Delta+\Delta'$, $(2\times\Delta)+\Delta'$ as precharge activation signals to precharge circuits (not shown) for the bank groups 503A, 502A and 501A from the delay circuits 541A, 542A and 543A respectively. The circuit 520A may provide the power-up signals with delays $\Delta$, $2\times\Delta$, $3\times\Delta$, $4\times\Delta$ as precharge activation signals to precharge circuits (not shown) for the bank groups 505A, 506A, 507A and 508A from the delay circuits 544A, 545A, 546A and 547A respectively. The semiconductor device 500 may further include a via 550A that has one end coupled to the first die 510A and another end coupled to the second die 510B. In some embodiments, the via 550A may be a via TSV 450A (e.g., through-substrate or through-silicon vias). The via 550A may be coupled to the delay circuit 547A of the circuit 520A. The via 550A may receive the power-up signal with the delay from the delay circuit 547A and provide the received power-up signal to the die 510B. In some embodiments, the delay may be a sum of delays of the delay circuits 544A, 545A, 546A and 547A coupled in series.

In some embodiments, the die 510B may include a voltage power-up circuit 540B for the die 510B. The voltage power-up circuit 540B may detect whether a power supply circuit for the die 510B (not shown) starts receiving the power supply potentials (e.g., VDD1 and VDD2). Responsive to the detection, the voltage power-up circuit 540B may provide a power-up signal in an active state. In some embodiments, the circuit 520B may receive the power-up signal for the bank groups 501B-508B from the voltage power-up circuit 540B.

The circuit 520B may include a timing adjustment circuit 560. The time adjustment circuit 560 may be coupled to the via 550A. The time adjustment circuit 560 controls the timing of activating precharge operations of main data lines MIO (not shown) of the bank groups 501B-508B on the die 510B to begin after the activation of most, if not all of precharge operations of main data lines MIO (not shown) of the bank groups 501A-508A on the die 510A. As a result, precharge operations to the main data lines MIO of the bank groups 501B-508B on the die 510B may be performed following most of the precharge operations to the main data lines MIO of the bank groups 501A-508A on the die 510A.

The time adjustment circuit 560 may receive the power-up signal from the voltage power-up circuit 540A with a delay from the delay circuit 547A through the via 550A. The time adjustment circuit 560 may also receive the power-up signal from the voltage power-up circuit 540B. The time adjustment circuit 560 may provide the power up signal from the voltage power-up circuit 540B in an active state responsive to the power up signal from the voltage power-up circuit 540A in an active state as a precharge activation signal. In some embodiments, the time adjustment circuit 560 may include a NAND logic which receives the power up signal from the voltage power-up circuit 540A with the delay from the via 550A and the power up signal from the voltage power-up circuit 540B. The time adjustment circuit 560 may also include an inverter which provides an inverted output signal of the NAND logic as the precharge activation signal. The circuitry of the time adjustment circuit 560 may not be limited to this combination of logic circuits. Any variations of circuitry that may function as the time adjustment circuit 560 may be included in the circuit 520B.

The circuit 520B may include delay circuits 541B-543B coupled in series. The circuit 520B may also include delay circuits 544B-547B coupled in series. In some embodiments, each of the delay circuit 542B-547B may have a delay $\Delta$ and the delay circuit 541B may have a delay $\Delta'$. The circuit 520B may provide the precharge activation signals from the time adjustment circuit 560 with delays $\Delta'$, $\Delta+\Delta'$, $(2\times\Delta)+\Delta'$ as precharge activation signals to precharge circuits (not shown) for the bank groups 503B, 502B and 501B from the delay circuits 541B, 542B and 543B respectively. The circuit 520B may provide the precharge activation signals from the time adjustment circuit 560 with delays $\Delta$, $2\times\Delta$, $3\times\Delta$, $4\times\Delta$ as precharge activation signals to precharge circuits (not shown) for the bank groups 505B, 506B, 507B and 508B from the delay circuits 544B, 545B, 546B and 547B respectively. The circuit 520B may further include a via 550B. In some embodiments, the via 550B may be a via TSV 450B (e.g., through-substrate or through-silicon vias). The via 550B may be coupled to the delay circuit 547B. The via 550B may receive an output signal from the delay circuit 547B and provide the received power-up signal to another die (Die x+2) (not shown).

Because the time adjustment circuit 560 may provide the power up signal from the voltage power-up circuit 540B in the active state when the power up signal from the voltage power-up circuit 540A is the active state, the precharge timing circuit 520 may provide the power-up signals delayed by different delays to precharge circuits for the bank groups 501A-508A and 501B-508B, including the power-up signals delayed by longer delays to the precharge circuits for the bank groups 501B-508B. Thus, precharge operations to the main data lines MIO of the bank groups 501A-508A and main data lines MIO of the bank groups 501B-508B may be performed at different timings. The precharge timing circuit 520 may include a circuit that includes a timing adjustment circuit and a via in each die in a similar manner to the die 510B. The main data lines MIO of bank groups of a plurality of dies may be precharged at different times. Thus, peak current within the semiconductor device 500 may be reduced by performing the precharge operations to main data lines MIO of multiple memory bank groups on the plurality of dies at different timings.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
   a first memory channel that comprises:
   a first memory interface;
   a first memory bank including a first data line; and
   a second memory bank including a second data line;
   a second memory channel that comprises:
   a second memory interface independent of the first memory interface;
   a third memory bank including a third data line; and
   a fourth memory bank including a fourth data line; and
   a precharge timing circuit configured to provide first, second, third and fourth precharge activation signals, the first precharge activation signal configured to activate precharge of the first data line, the second precharge activation signal configured to activate precharge of the second data line responsive, at least in part, to the first precharge activation signal, the third precharge activation signal configured to activate precharge of the third data line, and the fourth precharge activation signal configured to activate precharge of the fourth data line responsive, at least in part, to the third precharge activation signal, wherein the precharge timing circuit provides the first and second precharge activation signals at different times from each other and provides the third and fourth precharge activation signals at different times from each other.

2. The apparatus of claim 1, wherein the precharge timing circuit comprises:
   a first delay circuit configured to provide the second precharge activation signal responsive, at least in part, to the first precharge activation signal; and
   a second delay circuit configured to provide the fourth precharge activation signal responsive, at least in part, to the third precharge activation signal.

3. The apparatus of claim 2, wherein the first memory channel further comprises a fifth memory bank coupled to a fifth data line,
   wherein the precharge timing circuit further comprises a third delay configured to provide a fifth precharge activation signal configured to activate precharge of the fifth data line responsive, at least in part, to the first precharge activation signal, and
   wherein the precharge timing circuit provides the second precharge activation signal and the fifth precharge activation signal at different times from each other.

4. The apparatus of claim 1, wherein the precharge timing circuit provides the first, second, third and fourth activation signals at different times from one another.

5. The apparatus of claim 4, further comprising a time adjustment circuit configured to receive the first precharge activation signal with a delay and further configured to provide the third and the fourth precharge activation signals responsive, at least in part, to the first precharge activation signal with the delay.

6. An apparatus comprising:
   a first memory cell array including first and second memory banks;
   a second memory cell array including third and fourth memory banks;
   first, second, third and fourth data lines included in the first, second, third and fourth memory banks respectively;
   first, second, third and fourth precharge circuits configured to precharge the first, second, third and fourth data lines respectively; and
   a precharge timing circuit configured to provide first, second, third and fourth precharge activation signals to the first, second, third and fourth precharge circuits respectively,
   wherein the precharge timing circuit is configured to provide the second precharge activation signal responsive, at least in part, to the first precharge activation signal, and
   wherein the precharge timing circuit is configured to provide the fourth precharge activation signal responsive, at least in part, to the third precharge activation signal.

7. The apparatus of claim 6, wherein the precharge timing circuit comprises:
   a first circuit configured to provide the first precharge activation signal responsive to a first power-up signal; and
   a second circuit configured to provide the third precharge activation signal responsive to a second power-up signal.

8. The apparatus of claim 7, further comprising:
   a first power supply circuit configured to provide a first power supply potential to the first and second precharge circuits, the first power supply circuit including a first voltage power-up circuit configured to detect when the first power supply circuit starts receiving the first power supply potential and further configured to provide the first power-up signal responsive to the detection of reception of the first power supply potential; and
   a second power supply circuit configured to provide a second power supply potential to the third and fourth precharge circuits, the second power supply circuit including a second voltage power-up circuit configured to detect when the second power supply circuit starts receiving the second power supply potential and further configured to provide the second power-up signal responsive to the detection of reception of the second power supply potential.

9. The apparatus of claim 7, wherein the first circuit is configured to provide the first power-up signal with a delay, and
   wherein the second circuit is configured to receive the first power-up signal with the delay from the first circuit, and further configured to provide the third precharge activation signal responsive, at least in part, to the first power-up signal with the delay.

10. The apparatus of claim 9, wherein the second circuit comprises a time adjustment circuit configured to receive the second power-up signal and the first power-up signal with the delay from the first circuit, and further configured to provide the second power-up signal as the third precharge activation signal responsive, at least in part, to the first power-up signal with the delay.

11. The apparatus of claim 10, wherein the time adjustment circuit comprises:
    an inverted AND gate logic circuit configured to receive the second power-up signal and the first power-up signal with the delay from the first circuit and configured to provide an output signal; and
    an inverter configured to receive the output signal, invert the output signal and provide the inverted output signal.

12. The apparatus of claim 9, wherein the first circuit comprises a delay circuit configured to provide the first power-up signal with the delay.

13. The apparatus of claim 12, wherein the delay circuit is a first delay circuit and the delay is a first delay,
wherein the first circuit comprises a plurality of second delay circuits coupled in series including the first delay circuit, configured to provide the first power-up signal with the first delay from the first delay circuit, and
wherein the first delay is a sum of delays of the plurality of second delay circuits.

14. The apparatus of claim 13, wherein each second delay circuit of the plurality of delay circuits has a second delay.

15. The apparatus of claim 14, wherein the plurality of second delay circuits further comprises a third delay circuit configured to provide the second precharge activation signal that is the first precharge activation signal with the second delay.

16. The apparatus of claim 15, further comprising:
a fifth memory bank in the first memory array including a fifth data line; and
a fifth precharge circuit configured to precharge the fifth data line,
wherein the first circuit further comprises a fourth delay circuit configured to provide a fifth precharge activation signal that is the first precharge activation signal with a third delay, and
wherein the third delay is shorter than the second delay.

17. An apparatus comprising:
a first die including first and second memory bank groups;
a second die including a third memory bank group;
first, second and third data lines included in the first, second and third memory bank groups respectively; and
a first circuit on the first die, the first circuit configured to receive a first power-up signal, and further configured to provide first and second precharge activation signals responsive, at least in part, to the first power-up signal, the first precharge activation signal configured to activate precharge of the first data line, and the second precharge activation signal configured to activate precharge of the second data line, wherein the second precharge activation signal is the first precharge activation signal with a first delay;

a second circuit on the second die, the second circuit configured to provide a third precharge activation signal, the third precharge activation signal configured to activate precharge of the third data line; and
a via configured to receive the second precharge activation signal from the first circuit and further configured to provide the second precharge activation signal with a second delay to the second circuit,
wherein the second circuit is configured to receive the second precharge activation signal with the second delay from the via and further configured to provide the third precharge activation signal responsive, at least in part, to the second activation signal with the second delay.

18. The apparatus of claim 17, wherein the second circuit comprises a time adjustment circuit configured to receive a second power-up signal and the second precharge activation signal with the second delay, and further configured to provide the second power-up signal as the third precharge activation signal responsive, at least in part, to the second precharge activation signal with the second delay.

19. The apparatus of claim 18, wherein the time adjustment circuit comprises:
an inverted AND gate logic circuit configured to receive the second power-up signal and the second precharge activation signal with the second delay and configured to provide an output signal; and
an inverter configured to receive the output signal, invert the output signal and provide the inverted output signal.

20. The apparatus of claim 17, further comprising:
another via configured to receive a fourth precharge activation signal from the second circuit and further configured to provide the fourth precharge activation signal with a third delay, and
a third die configured to receive the fourth precharge activation signal with the third delay,
wherein the fourth precharge activation signal is the third precharge activation signal with a fourth delay.

* * * * *